July 21, 1964 W. M. HENEBRY 3,141,981
PULSE GENERATING CIRCUIT HAVING A HIGH REPETITION RATE UTILIZING AVALANCHE TRANSISTOR-COAXIAL LINE COMBINATION
Filed July 3, 1962
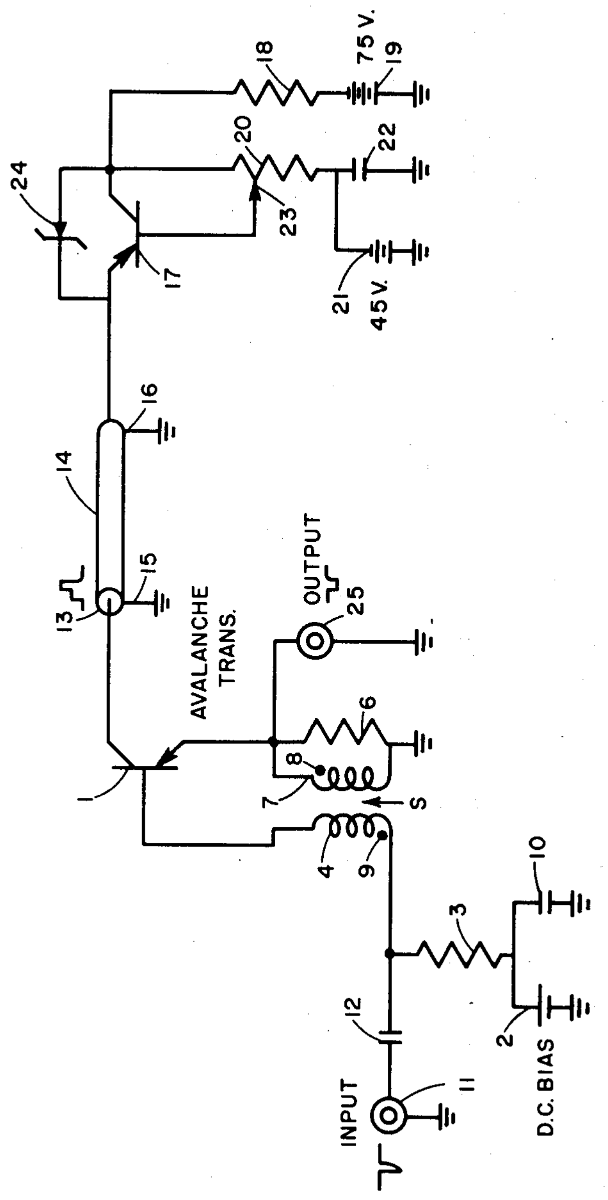
INVENTOR.
William Michael Henebry
BY [signature]

United States Patent Office 3,141,981

Patented July 21, 1964

3,141,981

PULSE GENERATING CIRCUIT HAVING A HIGH REPETITION RATE UTILIZING AVALANCHE TRANSISTOR-COAXIAL LINE COMBINATION

William Michael Henebry, Monticello, Ill., assignor, by mesne assignments, to the United States of America as represented by the Secretary of the Navy Filed July 3, 1962, Ser. No. 207,444
10 Claims. (Cl. 307—88.5)

The present invention relates generally to pulse generating circuits and, more particularly, to a new and improved pulse generating circuit which makes use of the avalanche switching phenomenon in transistors to develop pulses having a rise time in the order of $\approx 1\eta$ sec. at a high repetition rate.

The advantages of avalanche circuitry include economy of circuit components, minimum temperature sensitivity, large voltage and charge gains, extremely fast action time, short propagation delay and extreme sensitivity. However, circuits employing the avalanche switching mode of operation also possess certain disadvantages, such as, limited repetition rate or low duty cycle, large ratio of recovery time to action time, propagation delay which is dependent upon input and a possibility of catastrophic failure. Whether the last-mentioned item should be considered a disadvantage or an advantage depends for the most part upon whether a complete circuit failure is preferred over a gradual deterioration of performance.

Plus generating circuits which utilize the avalanche switching mode of transistor operation are known in the prior art. In one common circuit the avalanche transistor is connected in a common emitter configuration, and the avalanche phenomenon takes place when a triggering signal, coupled to the base, overcomes a reverse-bias applied between the emitter and base of the transistor. Connected to the collector of this transistor is a storage capacitor which forms the output pulse by discharging through the transistor when avalanche occurs. Since this storage capacitor must be recharged after each pulse through a relatively high resistance in the collector circuit, the system cannot operate at a high pulse repetition rate. Another unfavorable feature of this circuit is the shape of the output pulse which, although it has an extremely sharp leading edge, droops and then undershoots in the tail portion thereof.

Even though the basic circuit suffers from the above defects, nevertheless, it can be used in situations where the input signal is not greatly variable in amplitude and a pulse repetition rate below about 100 kc. is suitable. The pulse generator of the present invention, therefore, retains the simplicity of this circuit while improving its general performance.

The primary object of the present invention is to provide a pulse generating circuit for producing pulses at a high repetition rate.

Another object of the present invention is to provide a pulse generating circuit utilizing the avalanche switching mode of transistor operation to develop short rise-time pulses having a high repetition rate.

Another object of the present invention is to provide a high duty cycle pulse generating circuit which employs the mechanism of transistor avalanche.

A still further object of the present invention is to provide a relatively simple pulse generating circuit having as a component thereof an avalanche transistor which is insensitive to variations in input pulse width.

A yet still further object of the present invention is to provide a pulse generating circuit utilizing an avalanche transistor to develop pulses at high repetition rates which do not suffer from droop or excessive undershoot.

Other objects, advantages and novel features of the invention will become apparent from the following detailed description of the invention when considered in conjunction with the accompanying drawing, the single figure of which schematically illustrates a preferred embodiment thereof.

Briefly and in general terms, the objects of invention mentioned above are realized according to one modification of the invention by first adding to the circuit alluded to hereinbefore a transformer which intercouples the emitter and base circuits of the avalanche transistor in a degenerative feedback loop. By virtue of this coupling, the avalanche transistor sees only a short sample of the input pulse regardless of the length of this pulse. Thus, as soon as an input trigger pulse forward biases the emitter-base junction and sets off the avalanche phenomenon, a leading portion of the output pulse is fed back via the transformer with a short time delay to again reverse-bias the emitter-base junction. Consequently, the avalanche transistor sees an input pulse whose maximum width is determined by the total propagation delay from the input circuit, through the avalanche transistor, feedback circuit and back to the input circuit. The pulse generator circuit is thus insensitive to variations in input pulse width if these pulses have a duration which exceeds the loop propagation delay which may be reduced to one or two $\eta$ secs.

As mentioned hereinbefore, the output pulse produced by the discharge action of the storage capacitor coupled to the avalanche transistor, while it has a very desirable leading edge slope, droops off at its trailing edge and terminates in a long tail which may include an excessive undershoot portion. In order to improve the shape of this pulse, the present invention employs a coaxial line as the pulse forming means, thereby gaining a more rectangular pulse shape with only a slight degradation in the slope of the leading edge.

To extend the capability of the basic circuit into the high repetition rate region, a high speed emitter follower stage is coupled to the pulse forming coaxial line. This emitter follower stage supplies the collector of the avalanche transistor with a constant voltage, low impedance source of energy and allows the avalanche transistor to operate in a fashion determined by the coaxial line connecting the emitter follower and the collector of the avalanche transistor. At the same time this emitter follower insures a fast recovery of the voltage at the collector of the avalanche transistor, a condition which must be satisfied in order that the circuit may be triggered again without the need of an excessively large triggering signal. Since the collector voltage is quickly restored to its proper level after each output pulse, the dead time between these pulses can be reduced and the pulse repetition rate of the system correspondingly increased. This rate is limited only by the maximum dissipation of the avalanche transistor and the emitter follower.

Referring now to the drawing, the pulse generating circuit constructed in accordance with the present invention includes a first transistor 1 of the p-n-p type designed to operate in the avalanche mode when biased to the proper operating region. The transistors which best operate in this mode are those usually designed as fast switching units and fabricated with a thin and fairly uniform base region having radial symmetry. Transistor 1, which is biased with a voltage at its collector that is close to the breakdown point, is kept in a stable condition by a reverse-bias between its base and emitter. This bias is derived from battery 2, the negative terminal of which is grounded and the positive terminal of which is connected via resistance 3, the characteristic impedance terminating input coaxial line 11, and winding 4 of transformer 5 to the base. The emitter of avalanche transistor 1 is connected to ground through the parallel combination of resistance 6 of low value and winding 7 of transformer 5. Windings 4 and 6 of this transformer have the polarity relationship indicated by dots 8 and 9 and, consequently, they provide degenerative feedback between the emitter and base circuits. Bias battery 2 is shunted by capacitor 10.

The input triggering signals, which are negative pulses of appropriate amplitude, are introduced into the system via a coaxial line 11 and fed to the base of transistor 1 via coupling capacitor 12 and winding 4 of transformer 5. The output pulses are taken from the circuit by means of a coaxial line 25, connected across resistor 6, whose inner conductor is connected to the emitter and whose outer conductor is grounded.

The collector of avalanche transistor 1 is connected to one end of the inner conductor 13 of a pulse forming coaxial line 14 whose outer conductor is grounded at opposite ends 15 and 16. The other end of the inner conductor is connected to the emitter of transistor 17 which is of the p-n-p type. The collector of this transistor is connected via resistance 18 to the negative terminal of a first battery 19, the positive terminal of which is grounded, and also via potentiometer 20 to the negative terminal of a second battery 21, the other terminal of which is also grounded and whose voltage is less than that of battery 19. The former battery is also shunted by capacitor 12. The base of transistor 17 is connected to the movable tap 23 of potentiometer 20, and a Zener diode 24 is connected between the emitter and collector of transistor 17.

The operation of the pulse generating circuit described above is as follows:

In its standby position, a holding current $I_H$ flows in the circuit from voltage source 19 through resistor 18, the collector-emitter circuit of transistor 17, the center conductor 13 of coaxial line 14, the collector-base circuit of transistor 1, transformer winding 4 and resistor 3 to voltage source 2. This holding current, whose magnitude is established in part by the setting of potentiometer 20, maintains the voltage at the avalanche transistor slightly below the critical breakdown potential $BV_{CES}$. It will be apreciated that this current charges coaxial line 14 when the circuit is first activated and continues to flow until a triggering pulse appears at input terminal 11.

It would be pointed out that the emitter follower circuit tends to maintain the collector of avalanche transistor 1 at the same voltage as the base of transistor 17 and establish equal collector curents for these transistors.

When a negative input pulse of appropriate amplitude appears at the input circuit and forwardly biases the emitter-base junction of transistor 1, avalanche occurs and the collector of this transistor becomes connected to the emitter via a very small resistance. Coaxial line 14 thereupon starts discharging through this low resistance path to ground via resistor 6 and via output coaxial line 25 and the characteristic impedance, not shown, terminating this line. The voltage level of conductor 13 of coaxial line 14 at side 15, which has been highly negative up to this time, now experiences a large drop and a steep, positive going wave form is effectively generated at this side of the line. Simultaneously therewith, coaxial line 25, which heretofore has been at ground potential because of the reversed bias at the emitter-base junction of transistor 1, moves rapidly in a negative direction by an amount determined by the impedance relationship between coaxial line 14 and coaxial line 25 and any load coupled thereto. Consequently, a negative pulse having an extremely fast leading edge appears at the output circuit.

The positive going wave form at end 15 of coaxial line 14 developed in response to the above discharge action now travels down the line until it reaches end 16. Although this pulse tends to increase the current flow through transistor 17 by raising the emitter voltage and create a low impedance termination for this line, the response of this transistor circuit in terms of the rise time of this positive wave form is too slow for this to happen. Consequently, the positive pulse instantaneously sees an impedance which is greater than the characteristic impedance of coaxial line 14. Hence, it experiences a reflection at this end without a phase inversion and proceeds back down the coaxial line. When it subsequently arrives at end 15, it drives the collector of transistor 1 sharply in a more positive direction and abruptly terminates the avalanche phenomenon, thereby defining the trailing edge of the output pulse. It would be seen from this that the width of the output pulse is governed by the length of the coaxial line. With the avalanche curtailed, coaxial line 25 starts discharging through resistor 6 to form the terminating portion of the output pulse.

When coaxial line 14 discharges, the entire supply voltage is effectively across transistor 17 because of the relatively low impedance of this line. This voltage, of course, could seriously damage transistor 17 and cause it to break down or possibly punch through. However, before this condition can occur, Zener diode 24 conducts and provides shunt protection for this transistor. Not only does diode 24 act as a protecting device but, additionally, it serves as a low impedance path for recharging coaxial line 14. The charging current which now flows in the system has a low impedance path since it flows from battery 19 via the relatively low resistor 18 and diode 24. Consequently, the collector voltage of transistor 1 moves rapidly in a negative direction back towards its starting level. However, as it nears this level, diode 24 no longer conducts, and the final incremental current is supplied via transistor 17. Hence, the collector voltage of the avalanche transistor approaches its critical standby point at a safe rate. With coaxial line 14 now recharged and coaxial line 25 discharged, the circuit is reset and ready for a second cycle which takes place when the next triggering pulse occurs at terminal 11.

It would also be pointed out that should avalanche transistor 1 fail, for example, by short-circuiting, Zener diode 24 again protects transistor 17 from excessive disdipation. It would also be stressed that since there are no large impedances in this circuit which can serve to limit the maximum circuit dissipation to a safe value, care must be taken in adjusting the setting of potentiometer 20 when installing the avalanche transistor; that is, the voltage at the collector of transistor 1 must not be allowed to exceed the emitter-base reverse bias.

The basic avalanche circuit mentioned previously also displays a dependence upon the rate of rise of the input signal. This dependence may be minimized by connecting transformer 5 to yield regenerative feedback. This provision need not be used, of course, if the input signal is fast enough to reach the trigger threshold in a time less than the loop propagation delay. However, in cases where the input signal is slowly rising, the regenerative connection will greatly enhance the certainty of threshold level. It would be noted, however, that regenerative feedback tends to make the circuit free-running for small D.C. bias levels.

In situations which require a circuit with an input sensitivity greater than that possessed by an avalanche circuit, a simple bistable tunnel diode circuit may be used to trigger the avalanche transistor, and some portion of the output pulse may be used to reset the tunnel diode circuit.

It will be recognized that instead of using a p-n-p-transistor as the avalanching element, the circuit can function with a n-p-n type. However, transistor 17 would have to be replaced by an electron tube. Also, the biasing conditions, of course, would have to be reversed in accordance with well known practices. It would also be mentioned that the degradation of the leading edge of the output pulse brought about by the coaxial line may be alleviated somewhat by the addition of a small discharge capacitor connected between center conductor 13 and ground at side 15 of the coaxial line.

Obviously many modifications and variations of the present invention are possible in the light of the above teachings. It is therefore to be understood that within the scope of the appended claims the invention may be practiced otherwise than as specifically described.

What is claimed is:

1. A pluse generating circuit comprising, in combination, a transistor having a base and first and second electrodes, said transistor being capable of experiencing an avalanche breakdown when predetermined bias conditions exist at said base and said first and second electrodes, a coaxial line, means for coupling one side of said coaxial line to said second electrode, means for connecting the other side of said coaxial line to a source of charging voltage, an output circuit connected between one of said electrodes and a reference potential, means for applying a blocking bias to said base to maintain said transistor near the avalanche breakdown point when said coaxial line is fully charged, and means for periodically coupling trigger pulses to said base for overcoming said blocking bias and driving said transistor into an avalanche breakdown, said coaxial line discharging through said transistor during avalanche, whereby output pulses are generated across said output circuit, and means for coupling inverted output pulses back to the base of said transistor to shorten the effective length of each trigger pulse.

2. A pulse generator comprising, in combination, a transistor having a base and first and second electrodes, a coaxial line, one end of the inner conductor of said coaxial line being connected to said second electrode, the other end of said inner conductor of said coaxial line being coupled to a voltage source via a first and second charging path, an output circuit connected between one of said electrodes and a reference potential, means for biasing said base with respect to said first electrode such that said transistor is held near the avalanche region when said coaxial line is charged to a predetermined level, means for periodically applying trigger pulses to said base to overcome said bias and drive said transistor into said avalanche region, said coaxial line discharging each time said transistor avalanches to develop a fast rise-time pulse across said output circuit, said first charging path being effective when said coaxial line is discharged to recharge said coaxial line during the period between successive trigger pulses at a fast rate to an intermediate voltage level below said predetermined voltage and said second charging path being thereafter effective to continue to recharge said coaxial line at a slower rate to said predetermined voltage level whereby said transistor is safeguarded against being driven into said avalanche region.

3. In an arrangement as defined in claim 2 wherein said first path includes a diode and said second path includes a transistor, said diode conducting when said coaxial line is discharged and thereafter rendered nonconducting when said coaxial line is recharged to said intermediate voltage level.

4. In an arrangement as defined in claim 2, means for degeneratively coupling back output pulses to the base of said transistor for shortening the effective length of each trigger pulse.

5. A pulse generator circuit comprising, in combination, a p-n-p transistor, said transistor having a base, an emitter and a collector, a coaxial line, one end of the inner conductor of said coaxial line being connected to said collector, the other end of said inner conductor being connected to a negative voltage source via a first and second charging path, an output circuit connected between said emitter and a reference potential, means for biasing said base with respect to said emitter such that said transistor is maintained near the avalanche region when said coaxial line is fully charged from said negative voltage source, means for applying trigger pulses periodically to said base to overcome said bias and drive said transistor into said avalanche region, said coaxial line discharging each time said transistor avalanches whereby an output pulse is developed across said output circuit, means for coupling inverted output pulses back to said base of effectively shorten each trigger pulse, said first and second charging paths being alternately effective during the period between successive trigger pulses for recharging said coaxial line at two different rates with the slower rate occurring when said coaxial line reaches an intermediate voltage level above the discharge level.

6. In an arrangement as defined in claim 5, a transformer degeneratively coupling the collector and base of said avalanche transistor for feeding an inverse output pulse to said base for shortening the effective length of each trigger pulse.

7. In an arrangement as defined in claim 5 wherein said first path includes a Zener diode and said second path includes a second p-n-p transistor, said Zener diode being connected across the emitter and collector of said second transistor.

8. A pulse generator comprising, in combination, a transistor having a base and first and second electrodes, said transistor being capable of experiencing an avalanche breakdown when predetermined bias conditions exist at said base and said first and second electrodes, a coaxial line coupled to said second electrode, means for charging said coaxial line to a predetermined voltage level, means for biasing said base to a voltage level with respect to said first electrode such that said transistor is maintained near said avalanche breakdown point when said coaxial line is charged to said predetermined voltage level, an output circuit connected between one of said electrodes and a reference potential, means for coupling trigger pulses to the base of said transistor to drive said transistor into an avalanche breakdown, said coaxial line discharging through said avalanching transistor and developing an output pulse across said output circuit and a negative feedback path intercoupling said first electrode and the base of said transistor for shortening the effective length of each trigger pulse.

9. In an arrangement as defined in claim 8 wherein said means for charging said coaxial line to said predetermined voltage level includes a source of charging potential and first and second parallel circuits connected between said source of potential and said coaxial line, said first path permitting said coaxial line to be charged at a high rate when the voltage level of said coaxial line is low and said second path permitting said coaxial line to be charged at a lower rate when the voltage level of said coaxial line approaches said predetermined level.

10. In an arrangement as defined in claim 9 wherein said first and second parallel circuits connected between said source of potential and said coaxial line are automatically rendered effective in an alternative manner whereby said coaxial line is charged initially at a high rate and then at a lower rate until the voltage level of said coaxial line approaches said predetermined level.

References Cited in the file of this patent

UNITED STATES PATENTS 2,470,550 Evans ---------------- May 17, 1949

OTHER REFERENCES

The Institute of Electrical Engineers Journal, September 1957, pages 509, 510, "High-Speed Avalanche Transistors."

The Bell System Technical Journal, September 1955, vol. XXXIV, No. 5, "Alloyed Function Avalanche Transistors," by Miller et al.